United States Patent
Marcy, 5th et al.

(10) Patent No.: US 6,232,847 B1
(45) Date of Patent: *May 15, 2001

(54) TRIMMABLE SINGLEBAND AND TUNABLE MULTIBAND INTEGRATED OSCILLATOR USING MICRO-ELECTROMECHANICAL SYSTEM (MEMS) TECHNOLOGY

(75) Inventors: Henry O. Marcy, 5th, Camarillo; Kenneth D. Pedrotti; David R. Pehlke, both of Thousand Oaks; Charles W. Seabury, Calabasas; Jun J. Yao, Thousand Oaks, all of CA (US); James L. Bartlett, Cedar Rapids, IA (US); Mau Chung F. Chang; Deepak Mehrotra, both of Thousand Oaks, CA (US); J. L. Julian Tham, Irvine, CA (US)

(73) Assignee: Rockwell Science Center, LLC, Thousand Oaks, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/086,181

(22) Filed: May 28, 1998

Related U.S. Application Data (63) Continuation-in-part of application No. 09/004,679, filed on Jan. 8, 1998, now Pat. No. 5,959,516, and a continuation-in-part of application No. 08/985,564, filed on Dec. 5, 1997, now Pat. No. 5,994,985, and a continuation-in-part of application No. 08/848,137, filed on Apr. 28, 1997, now Pat. No. 5,872,489, and a continuation-in-part of application No. 08/848,116, filed on Apr. 28, 1997, now Pat. No. 5,880,921.

(51) Int. Cl.[7] ................................................ H03J 3/20
(52) U.S. Cl. ................. 331/167; 331/117 R; 331/36 C; 331/36 L; 331/177 R; 333/262; 334/14; 334/55; 334/56; 334/61
(58) Field of Search .............................. 331/36 L, 36 C, 331/177 R, 181, 117 R, 167; 334/56, 55, 14, 61; 336/200; 333/262

(56) References Cited

U.S. PATENT DOCUMENTS

| | | | |
|---|---|---|---|
| 5,578,976 | 11/1996 | Yao et al. | 333/262 |
| 5,808,527 | * 9/1998 | De Los Santos | 333/205 |
| 5,872,489 | * 2/1999 | Chang et al. | 331/179 |
| 5,880,921 | * 3/1999 | Tham et al. | 361/233 |

FOREIGN PATENT DOCUMENTS 9720388  6/1997  (WO) ............................ H03H/11/46

OTHER PUBLICATIONS

Young, Boser, A Micromachined Variable Capacitor for Monolithic Low–Noise VCOS, Solid–State Sensor and Actuator Workshop, Hilton Head, South Carolina, Jun. 2–6, 1996, pp. 86–89.

Richard C. Dorf, "Control Circuits", *The Electrical Engineering Handbook*, CRC Press, 1993, pp. 1011–1013.

Cheng T. Wang, "MMIC Circuit Elements", *Introduction to Semiconductor Technology: GaAs and Related Compounds*, John Wiley & Sons, 1990, pp. 422–433.

William H. Hayt, Jr., Jack E. Kemmerly, "Parallel Resonance", *Engineering Circuit Analysis*, Second Edition, McGraw–Hill Book Company, 1962, pp. 396–408.

* cited by examiner

Primary Examiner—Arnold Kinkead
(74) Attorney, Agent, or Firm—Koppel & Jacobs

(57) ABSTRACT

A high-Q precision integrated reversibly trimmable single-band oscillator and tunable multiband oscillator are presented that overcome the problems laser trimming and solid state switches. This is accomplished using micro-electromechanical system (MEMS) technology to integrate an amplifier and its tunable LC network on a common substrate. The LC network can be configured to provide a very narrow bandwidth frequency response which peaks at one or more very specific predetermined frequencies without de-Qing the oscillator.

14 Claims, 8 Drawing Sheets

TRIMMABLE SINGLEBAND AND TUNABLE MULTIBAND INTEGRATED OSCILLATOR USING MICRO-ELECTROMECHANICAL SYSTEM (MEMS) TECHNOLOGY

RELATED APPLICATIONS

This application is a continuation-in-part of applications Ser. No. 08/848,137 now U.S. Pat. No. 5,872,489 filed Apr. 28, 1997 entitled "INTEGRATED TUNABLE INDUCTANCE NETWORK AND METHOD," Ser. No. 08/985,564 now U.S. Pat. No. 5,994,985 filed Dec. 5, 1997 entitled INTEGRABLE HIGH-Q TUNABLE INDUCTOR AND CAPACITOR AND METHOD," Ser. No. 08/848,116 now U.S. Pat. No. 5,880,921 filed Apr. 28, 1997 entitled MONO-LITHICALLY INTEGRATED SWITCHED CAPACITOR BANK AND FABRICATION METHOD USING MICRO ELECTRO-MECHANICAL SYSTEM (MEMS) TECHNOLOGY," and Ser. No. 09/004,679 now U.S. Pat. No. 5,959,510 filed Jan. 8, 1998 entitled "TUNABLE-TRIMMABLE MICRO ELECTRO MECHANICAL SYSTEM (MEMS) CAPACITOR" all assigned to Rockwell Science Center, Inc and which are incorporated by reference herein.

BACKGROUND OF THE INVENTION

1. Field of the Invention

This invention relates to single and multiband oscillators, particularly high-Q precision integrated oscillators.

2. Description of the Related Art

An oscillator is an essential part of nearly every electronic instrument including signal, function and pulse generators, digital multimeters, oscilloscopes, computers and RF transmitters and receivers. At high frequencies, the preferred technique for generating the local oscillator signal is an LC-controlled oscillator, in which a tuned LC network is connected in an amplifier-like circuit to provide gain at its resonant frequency $\omega_0 = 1/\sqrt{LC}$. Overall positive feedback is then used to cause a sustained oscillation to build up at the LC's resonant frequency.

The performance of many RF oscillators depends critically on how precisely specific inductance and capacitance values can be provided in a circuit, and on the quality factor or "Q" of the circuit's reactive components. Q is defined as the maximum amount of energy stored divided by the amount of energy lost during one complete cycle. Thus, the circuit's frequency response peaks at a frequency determined by the circuit's inductance and capacitance values, and the width of the peak depends on the Q value of the circuit's components. Unwanted resistance tends to lower Q and flatten the frequency response.

Obtaining high-Q components with precise inductance values has traditionally been accomplished by either hand-selecting a component having desired characteristics from a batch, or by trimming the component as needed after manufacture. However, even state-of-the-art laser trimming methods impose limits on how closely one can get to a desired value, and both hand-selecting and trimming are expensive and labor-intensive. Furthermore, the lack of integration associated with discrete components increases both the size and cost of the oscillator to the point that such a system is not feasible in current microelectronic applications.

Integration enables the oscillator's inductors and capacitors to be made simultaneously with other circuit components, reduces the distance between a circuit's reactive and other components, eliminates the need for parasitic capacitance-causing wire bonds, and reduces the circuit's space and weight requirements, which are typically at a premium in wireless communications devices. However, integrated reactive components are difficult to trim to specific values and require a considerable amount of die area.

One method of providing a precise inductance (capacitance) value requires a number of fixed inductors (capacitors) to be fabricated on a substrate, which are then selectably interconnected with solid-state or off-chip switches to produce a desired value. Integrated switches capable of handling microwave frequencies are typically implemented with gallium arsenide (GaAs) MESFETs or PIN diode circuits. At signal frequencies above about 900 MHZ, such as those used by a cellular phone, these switching devices or circuits typically exhibit an insertion loss in the 'ON' (closed) state of about 1 db and a less-than-infinite isolation, typically no better than −30 dB in the 'OFF' (open) state. The insertion loss severely lowers Q, which causes the frequency response of the circuit to flatten out, lowering its selectivity and widening its bandwidth, often rendering the circuit impractical for use in wireless communications devices.

Consequently, trimmable RF oscillators that operate at frequencies above approximately 1 GHz use multiple chip sets that are fabricated with different technologies to optimize the capacitors, the FET switches, and the control circuitry, respectively, to get satisfactory insertion loss and isolation. For example, the capacitors may be formed on a glass substrate, the FET switches on a gallium arsenide substrate, and the control circuitry on a silicon substrate.

Some systems such as signal generators and RF transmitters/receivers require multiple frequency sources with each source providing a precise narrowband signal. Typically, these systems use a number of separate oscillators that are individually designed and trimmed to their respective resonant frequencies. This approach provides high quality and uniform precision and narrow bandwidth. However, the cost of multiple oscillators that are each dedicated to a single frequency can be significant.

Another known approach is to use solid state varactor diodes to provide a tunable capacitor. The varactor's capacitance is set by a bias voltage, which is generated by a sub-circuit that can consume a significant amount of when tuning the varactor. A low power-consuming varactor's tuning ratio is limited to about 4:1, which limits its usefulness for some wideband applications such as the frequency agile secured communications. Furthermore, the signal current applied to the varactor will affect the capacitance, inducing some measure of error.

Darrin J. Young and Bernhard E. Boser, "A Micromachined Variable Capacitor for Monolithic Low-Noise VCOS," Technical Digest of the 1996 Solid-State Sensor and Actuator Workshop, Hilton Head, S.C. pp. 86–89, 1996 discloses an aluminum micromachined variable capacitor for use as the tuning element in a voltage-controlled oscillator (VCO). This device is fabricated on top of a silicon wafer using conventional deposition techniques, and consists of a thin sheet of aluminum suspended in air above the substrate and anchored with four mechanical folded-beam suspensions acting as springs to form a parallel-plate capacitor. Compared to varactor diodes, this approach is amenable to monolithic integration in a standard electronic circuit process without sacrificing performance.

However, Young's parallel-plate structure has a number of drawbacks. First, the parallel-plate structure has a maximum vertical deflection of ⅓ of the initial gap between the parallel plates, which corresponds to a limited tuning range of at most 50%. Second, the capacitor's Q is 62 at 1 GHz, limited by the device parasitics and the amount of metal that can be deposited. Third, to isolate the DC control circuit from the signal voltage a pair of large inductors must be connected between the control circuit and the capacitor. On-chip inductors are of generally poor quality and discrete inductors reduce the overall circuit integration. Lastly, since the capacitance value is not fixed, it is sensitive to fluctuations in the signal voltage and external vibrations.

SUMMARY OF THE INVENTION

A high-Q precision integrated reversibly trimmable singleband oscillator and tunable multiband oscillator are presented that overcome the problems noted above. This is accomplished using micro-electromechanical system (MEMS) technology to integrate an amplifier and its tunable LC-network on a common substrate. The LC-network can be configured to provide a very narrow bandwidth frequency response which peaks at one or more very specific predetermined frequencies without "de-Qing", i.e., adversely affecting the Q of, the oscillator.

The trimmable singleband oscillator uses either a MEMS switching network to selectively interconnect fixed inductors or capacitors or reversibly trimmable MEMS inductors or capacitors to trim the resonant frequency of the local oscillator signal. The fixed reactive components may be interconnected in series, in parallel, or in a series/parallel combination, and may be designed with either equal or unique inductance values. The preferred MEMS components are elevated above the substrate to reduce parasitics. With this flexibility available, a precise value of inductance can be obtained by simply selecting and interconnecting the fixed inductors into a particular configuration. The preferred MEM switch has a very low insertion loss specification and near infinite isolation, so that placing one or more switches in series with a given inductor allows the inductor to be switched in and out of the network while introducing a very small amount of resistance, and thus has nearly no negative effect on the inductor's Q.

The reversibly trimmable MEMS inductor utilizes a "primary" coil and a "drive" coil that are placed in close proximity to each other and simultaneously driven with a primary current and a drive current, respectively, both of which are alternating currents. The drive current induces mutual components of inductance in the primary coil which vary with the phase and amplitude relationship between the two currents. The phase and amplitude relationships are controlled to precisely establish the primary coil's impedance, and thus achieve desired inductance values.

The reversibly trimmable MEMS capacitor comprises a tunable MEMS capacitor and an electrostatic actuator that selectively engages a stopper with teeth on the capacitor to fix its capacitance. To trim the capacitance, the actuator withdraws the stopper, the MEMS capacitor is trimmed to a desired capacitance, and the actuator reengages the stopper. The tunable MEMS capacitor can be either a single tunable capacitor to which both the signal and control voltages are applied or a master-slave configuration. Since the trimmed capacitance is locked, the master-slave configuration will not improve accuracy but does eliminate the need for isolation inductors.

The tunable multiband oscillator includes a single amplifier, a plurality of LC circuits that are tuned to different resonant frequencies in respective frequency bands, and a MEMS switching network that interconnects one of the LC circuits to the amplifier to set the resonant frequency of the local oscillator signal. The low ohmic loss of MEMS switches allows multiple LC circuits to be connected without de-Qing the resonant network and degrading the phase noise performance of the oscillator. The LC circuits can be either fixed resonator circuits or reversibly trimmable singleband resonators of the type described above.

Further features and advantages of the invention will be apparent to those skilled in the art from the following detailed description, taken together with the accompanying drawings.

BRIEF DESCRIPTION OF THE DRAWINGS

FIGS. 4a and 4b are plan and cross-sectional views, respectively, illustrating a reversibly trimmable MEMS inductor that can replace one or more inductor-switch pairs shown in FIG. 1a;

FIG. 8b is an lower-loss implementation of the reversibly trimmable MEMS capacitor shown in FIG. 8a;

DETAILED DESCRIPTION OF THE INVENTION

MEMS technology is used to provide high-Q precision integrated reversibly trimmable singleband oscillators and tunable multiband oscillators that overcome the problems noted above. Using MEMS technology, the oscillator can be configured to provide a very narrow bandwidth frequency response which peaks at one or more very specific predetermined frequencies without de-Qing the oscillator. Integration on a common substrate reduces parasitics, chip space and cost.

Figure 1A:
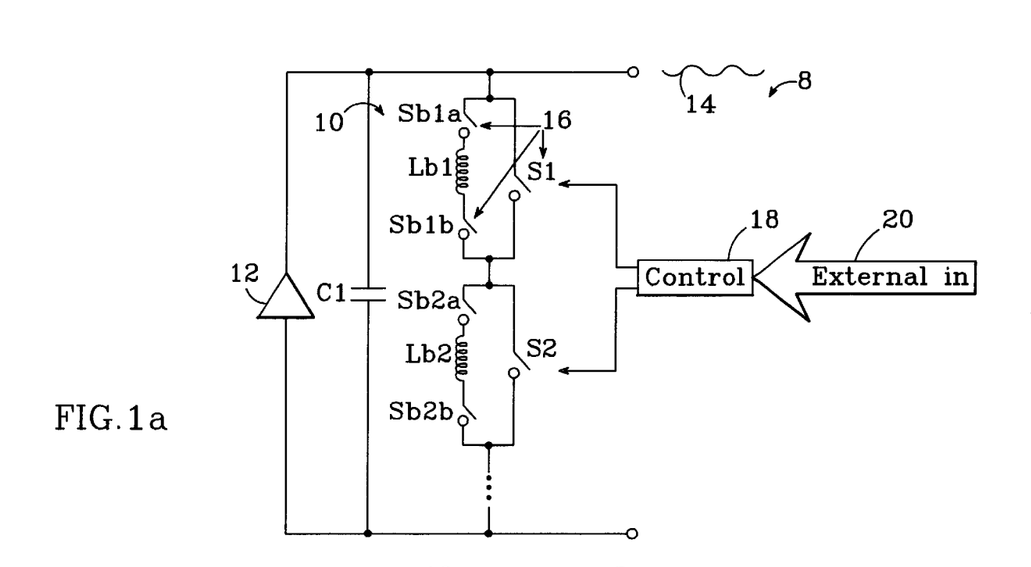
FIGS. 1a and 1b are schematic diagrams of possible trimmable singleband oscillator configurations integrated on a common substrate using MEMS technology per the present invention.
Figure 1B:
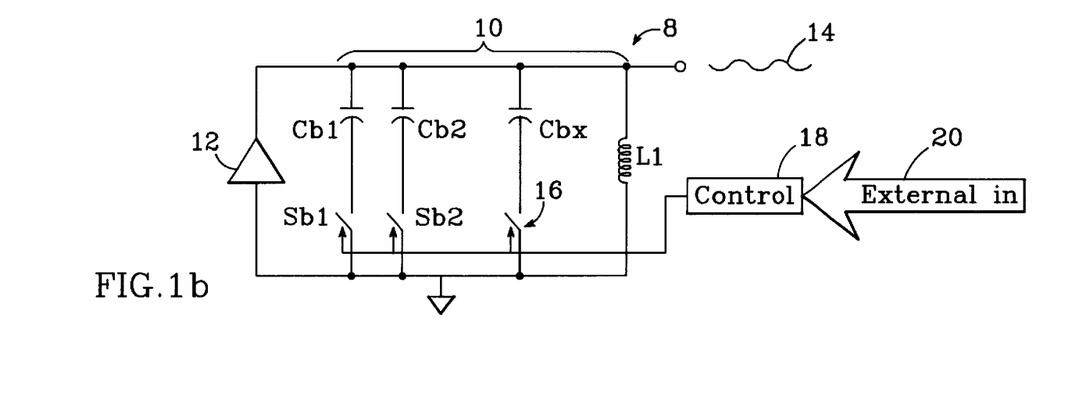

FIGS. 1a and 1b illustrate two possible ways in which the present invention can be configured. FIGS. 1a and 1b respectively depict the use of switchable inductor and capacitor arrays to tune the resonant frequency. In addition, FIG. 1a illustrates the use of "dual-switching" to improve component isolation. The inductors and capacitors may also be interconnected in series, in a series/parallel combination, with both components being switchable, and may be designed with either equal or unique values.

In the LC-controlled oscillator 8 shown in FIG. 1a, a trimmable LC network 10 is connected to an amplifier 12 to provide positive gain that causes a sustained oscillation at its resonant frequency to build up and generate the local oscillator signal 14. LC network 10 includes a number of series connected inductors $L_{b1}$, $L_{b2}$, ..., $L_{bx}$ that are configured in parallel with a capacitor $C_1$. Across each inductor $L_{b1}$, $L_{b2}$, ..., $L_{bx}$ is a control switch $S_{,1}$ $S_{,2}$... $S_{,x}$ which, when closed, causes its respective inductor to be bypassed. To improve isolation, each inductor also has a pair of isolation switches $S_{b1a}, S_{b1b}, S_{b2}, \ldots, S_{bx}$ connected in series and on opposite sides of it.

The inductance value is set by manipulating the state of the switches making up a switching network 16. Any single inductor is imposed into the signal path by opening its control switch and closing its respective pair of isolation switches; when the control switches of more than one inductor are closed, a series combination of the selected inductors is formed. The pair of isolation switches serve to completely isolate the inductor when it is not selected. Some applications may not require the isolation provided by this "dual switching" approach and may choose to use only the single control switch, which requires less die space.

Each inductor in the network can be fabricated to have the same inductance value, or each can have a unique inductance value. For example, assume that the inductance for each of inductors $L_{b1}$, $L_{b2}$, ..., $L_{bx}$ is equal to a common value L. The total inductance is then selectable between a minimum of 1L (i.e., 1×L), accomplished by closing all but one of switches $S_1$, $S_2$, ..., $S_x$, to a maximum of XL, obtained by opening all of switches $S_1$, $S_2$, ..., $S_x$ so that none of the inductors is bypassed. Steps of 2L, 3L, ..., (X−1)L are available in between the minimum and maximum by closing and opening switches appropriately. Closing all of the switches bypasses all of the switches, providing an inductance of nearly zero.

Greater resolution may be obtained by making the inductance value of at least some of the inductors small. For example, assume the inductance network includes 4 inductors $L_{a1}$–$L_{a4}$, with $L_{a1}$=1 µH, $L_{a2}$=0.5 µH, $L_{a3}$=0.2 µH and $L_{a4}$=0.1 µH. This configuration offers good resolution between 1 µH and 2 µH, but at the cost of a smaller overall inductance range than would be present if each inductor were equal to 1 µH, for example.

Because of the inductance value tolerance limitations inherent in known inductors, inductors used in resonant circuits often are deliberately designed with a low Q. A lower Q broadens the circuit's bandwidth, so that the passband resulting from less-than-perfect values of L will still pass the frequency of interest. Because of the precision with which an inductance value can be provided with the invention, there is no longer a need to compromise the value of Q.

One key to achieving both high-Q and precise tunability is the use of very low resistance switches to interconnect the fixed inductors, since any resistance presented by an inductor lowers its Q. In an inductance network as described herein, the resistance of concern is primarily that introduced by the switching devices. The insertion loss introduced by prior art switches such as GaAs MESFETs and PIN diode circuits, particularly at frequencies of 900 MHZ and above, can be as high as 1 db. These losses not only impose possibly unacceptable inefficiencies on the circuitry in which the switches are used, but also lower the Q of the circuitry's inductive components to a point at which the frequency selectivity needed by a communications device cannot be attained.

The MEMS switches $S_{a1a}$, $S_{a1b}$, ..., $S_{axb}$ as used herein refer to a device having at least one movable metal contact which bridges a gapped signal path when made to move from an "open" position to a "closed" position, typically in response to the application of an actuation signal, and which can be implemented on an I.C. substrate using well-known I.C. fabrication techniques. Switches of this type offer insertion losses as low as 0.1 db at high frequencies and provide virtually infinite isolation, thus making them well-suited for use in a tunable inductance network per the present invention. Circuit inefficiencies and negative effects on Q are substantially reduced when the switching network uses a MEM switch, which make the fabrication of a practical high-Q precisely tunable inductance network possible.

The preferred MEMS switch has at least one top electrode positioned on a cantilever arm which extends over at least one bottom electrode positioned on an I.C. substrate. When an actuation voltage is applied across the top and bottom electrodes, the cantilever arm is electrostatically drawn toward the substrate and one or more contact electrodes affixed to the substrate side of the cantilever arm bridge one or more gapped signal lines on the substrate surface, creating continuous signal paths. MEMS switches as discussed herein are discussed in Yao and Chang, "A Surface Micromachined Miniature Switch for Telecommunications Applications with Signal Frequencies from DC up to 4 GHz," In Tech. Digest (1995), pp. 384–387 and in U.S. Pat. No. 5,578,976 to Yao, which is assigned to the same assignee as the present application.

In the LC-controller oscillator 8 shown in FIG. 1b, LC network 10 includes a number of capacitors $C_{b1}$, $C_{b2}$, ..., $C_{bx}$ that are configured in parallel with an inductor $L_1$, with each capacitor having a switch $S_{b1}, S_{b2}, \ldots, S_{bx}$ connected in series with it. The switches form a switching network 16 that can be manipulated to set the capacitance value. Any single capacitor is imposed into the signal path by closing its switch; when the switches of more than one capacitor are closed, a parallel combination of the selected capacitor is formed. Some applications may require better isolation than is provided with a single switch and choose to use the "dual switching" approach shown in FIG. 1a. The same advantages as to precision, Q and integration described above in the context of the switchable inductors apply equally to the switchable capacitor network.

The embodiments shown in FIGS. 1a and 1b are intended as merely illustrative. An oscillator per the present invention can be configured as needed for a specific application, with consideration given to factors such as desired tuning range, desired resolution, number of inductance steps available between minimum and maximum inductance values, power dissipation, and desired Q.

Figure 2:
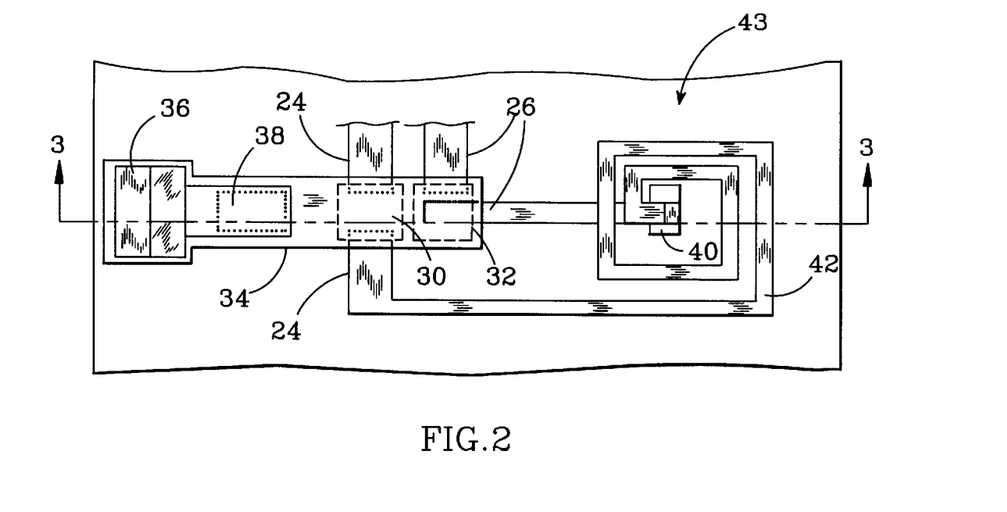
FIGS. 2 and 3 are plan and cross-sectional views, respectively, of the oscillator of FIG. 1a utilizing a single-pole double-through MEMS switch.
Figure 5:
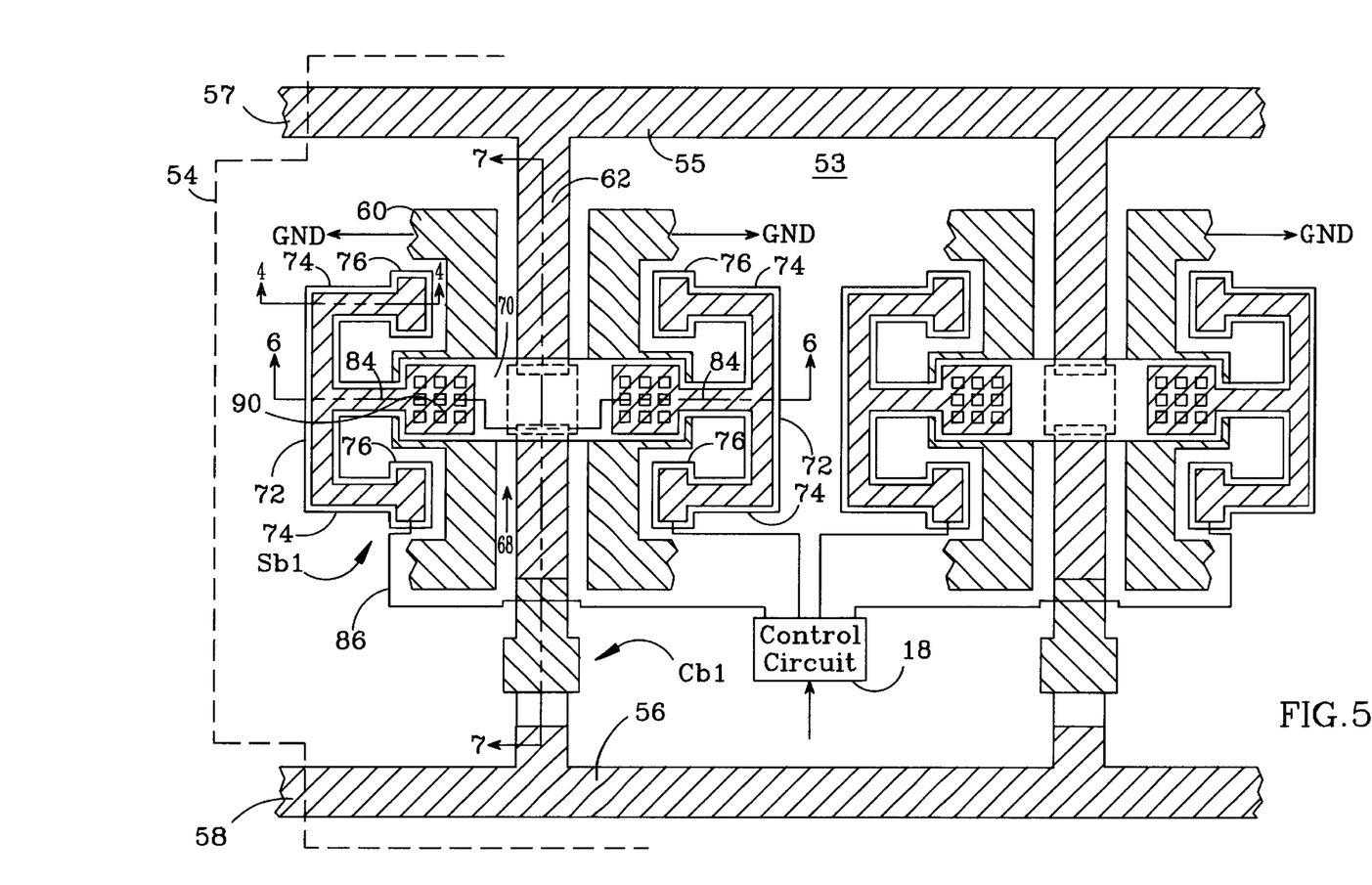
FIG. 5 is a plan view of the trimmable singleband oscillator shown in FIG. 1b implemented with an integrated MEM technology.

Another advantage offered by the invention is found when considering the fabrication of an inductance network, in that both the preferred MEMS switches, the inductors and the capacitors comprising the LC network may be integrated on a common substrate using common processing steps. The single-pole double-throw MEMS switch and an elevated inductor that are illustrative of a preferred configuration of the oscillator shown in FIG. 1a and one possible fabrication sequence are depicted in FIG. 2 (plan view) and FIG. 3 (corresponding cross-sectional view). The folded-cantilever beam MEMS switch and an elevated capacitor that are illustrative of a configuration of the oscillator shown in FIG. 1b and one possible fabrication sequence are depicted in FIG. 5 (plan view) and FIGS. 6 and 7 (corresponding to cross-sectional views).

Figure 3:
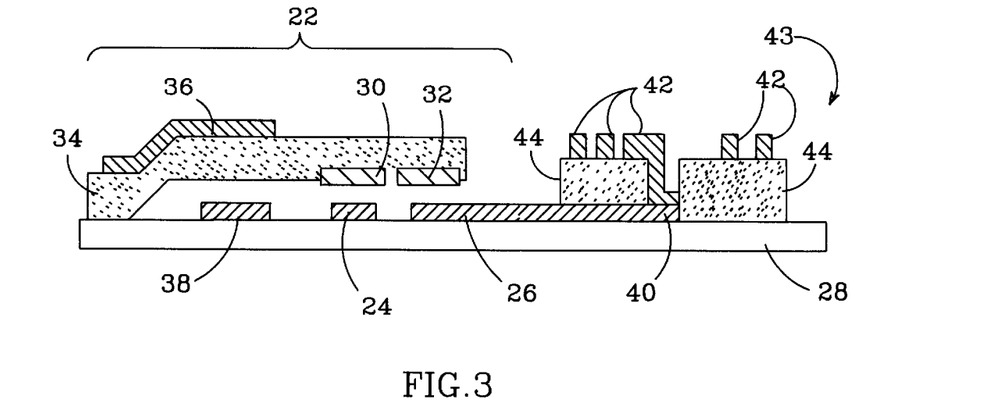
Figure 4A:
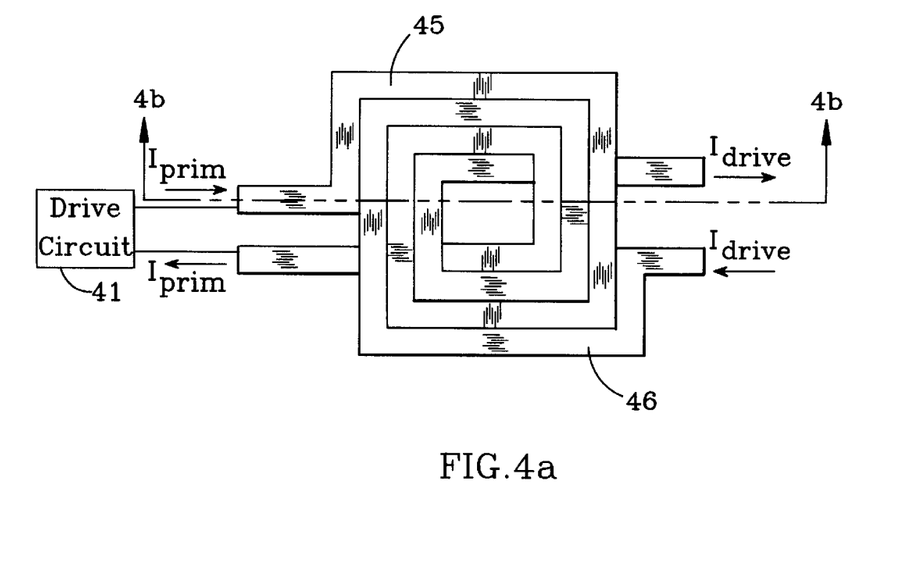

In FIGS. 3 and 4, the pair of MEMS switches are implemented with a single-pole double-throw switch 22 that has the capability to bridge two independent gapped signal lines 24 and 26 on substrate 28 when closed. This capability is attained by including two contact electrodes 30 and 32 on the switch's cantilever arm 34, with electrode 30 positioned to bridge gapped signal line 24 when closed, and electrode 32 positioned to bridge gapped signal line 26 when closed.

When the switch 22 is actuated in response to an actuation voltage applied across the top electrode 36 and the bottom electrode 38, a connection is made to both the center tap 40 and the outer coil 42 of an inductor 43. The inductor is preferably elevated above the substrate by support post 44. This arrangement is preferred because it reduces parasitic capacitance between the inductor coils and the substrate. Alternatively, the coils can be fabricated directly on an insulating substrate, with the center tap brought out over the coils via the use of air bridges. Contact electrodes 30 and 32 are preferably configured so that signal lines 24 and 26 are bridged nearly simultaneously when switch 22 is actuated, as well as opened nearly simultaneously when the switch is opened. Nearly simultaneous closure is preferred because reactive energy stored in the inductor may otherwise cause waveform distortion in the signal propagating through the inductor.

The MEMS structure is formed on substrate 28, which is not limited to any particular material, and is properly chosen based on other system considerations. For example, a glass substrate is inexpensive, allows large inductors to be formed on it, and reduces parasitic capacitance between the inductors and the substrate. Silicon or GaAs substrates may be preferable, however, if the inductance network is being integrated with other components which require the same substrate material. For example, wireless communications devices often use high-speed active devices which must be fabricated on a semi-insulating GaAs substrate. A device which utilized the present inductance network could integrate its active devices with the inductance network on a common GaAs substrate.

One possible technique for fabricating the MEMS structure shown in FIGS. 2 and 3 is to deposit a first sacrificial material, such as a layer of thermal setting polyimide, on substrate 28. A second sacrificial layer, such as a layer of pre-imidized polyimide that can be selectively removed from the first sacrificial layer, is then deposited. A layer of silicon nitride, preferably about 1500 Å thick, is then deposited and patterned using photolithography and reactive ion etching (RIE) in $CHF_3$ and $O_2$ chemistry. The pattern is transferred to the underlying polyimide layers using $O_2$ RIE. This creates a "lift-off" profile compatible with the selective deposition of metal into the distinct open areas.

A layer of metal is deposited, preferably by electron beam evaporation, which is about equal in thickness to the first sacrificial layer. The second sacrificial layer, the silicon nitride layer and the metal on top of it are then dissolved away in a solution such as methylene chloride, retaining the metal in the original open areas along with the first sacrificial layer. This first metal layer defines the bottom electrode 38 of the MEMS switch 22 and the traces which carry a voltage to the electrode, and two metal traces 24 and 26 which form the gapped signal lines which are bridged when the switch is actuated. The end of trace 26 which is not adjacent to trace 24 forms the center tap 40 of what will become an inductor. Traces 24 and 26 also include metal interconnection runs which connect, for example, to other switches and inductors which make up an inductance network.

Next, an additional sacrificial polyimide layer is deposited and patterned to form sloping sidewalls using $O_2$ RIE, and a selective deposition of a thick insulating material, preferably silicon dioxide, forms support post 44 for the inductor coils. Another layer of metal is deposited and patterned to form the switch's contact electrode 36 and the inductor coils 42. The area where the contact electrodes 30 and 32 will reside is preferably treated in an $O_2$ RIE plasma to etch a small amount, preferably 2000 Å–5000 Å, into the topmost sacrificial layer, so that the electrode is slightly recessed into the layer.

Cantilever arm 34 is formed from a layer, preferably about 2 μm thick, of PECVD silicon dioxide, patterned and etched with $CHF_3$ and $O_2$ RIE. A layer of metal, preferably aluminum about 2500 Å thick, is deposited, preferably using electron beam evaporation and lift-off, to form top electrode 36 for the switch. The top electrode 36 preferably comes down the sidewall and a metal trace extends from it; a voltage is applied to the top electrode via the metal trace to actuate the switch.

Figure 4B:
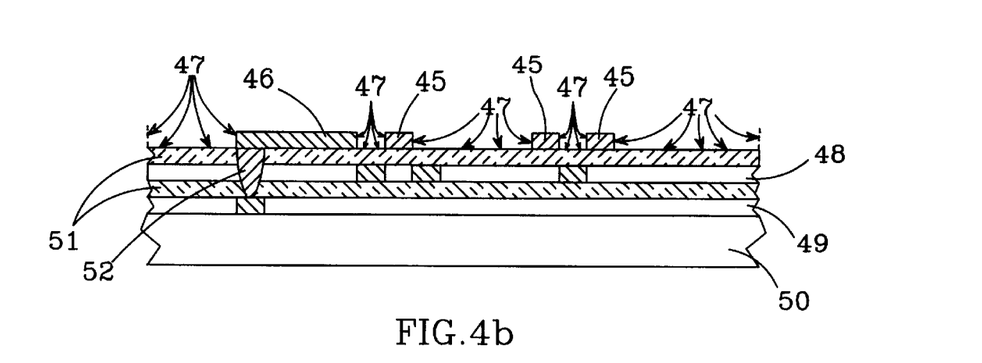

As an alternative to the switched inductor banks shown in FIG. 1a, the trimmable oscillator can be implemented using a reversibly trimmable MEMS inductor of the type illustrated in FIGS. 4a–4b, in which a drive circuit 41 drives a primary coil 45 and a drive coil 46 with respective alternating currents (AC) $I_{prim}$ and $I_{drive}$, preferably of the same frequency. When parallel currents travel in the same direction, each coil induces positive mutual components of inductance M in the other conductor. Parallel currents traveling in opposite directions induce negative mutual inductance components. When the two currents are completely coherent, i.e., $I_{prim}$ and $I_{drive}$ are in-phase and traveling in the same direction, the inductance L of the primary conductor is given by:

$$L=L_{self}+M,$$

where $L_{self}$ is the self-inductance of the primary conductor. When the two currents are in-phase and traveling in opposite directions, L is given by:

$$L=L_{self}-M.$$

The mutual component M may be continuously increased or decreased across this range based on the relative phases of the coupled currents, providing a tunable reactance in the primary conductor. A desired inductance value can thus be achieved in the primary conductor by establishing the appropriate phase and amplitude relationships between the currents. As a result, the oscillator's resonant frequency can be trimmed over a continuous rather than discrete frequency range.

Furthermore, because drive coil 46 can be used to boost the inductance of the primary coil 45, a desired inductance value can be obtained with a smaller coil than would be necessary with a conventional one-coil inductor. This provides several benefits: a smaller coil has less series resistance than does a larger coil, improving Q, and will also have a smaller parasitic capacitance. In addition, the amplitude and phase relationships can be manipulated so that the inherent resistance in the primary coil can be compensated so that it is nearly zero. It is this feature that enables the attainment of extremely high-Q values.

Using a standard 3-metal 0.5 μm CMOS process, the primary coil is fabricated on the top, "metal 3" layer 47, and the drive coil fabricated on the middle, "metal 2" layer 48. Also present are a "metal 1" layer 49, silicon substrate 50, and intervening layers 51 which are typically silicon dioxide ($SiO_2$). Vias 52 can be used to connect the coils to other circuitry, with interconnecting traces in the metal 1 layer, for example. The metal 3 layer is preferred for the primary coil because is furthest from the substrate, thus offering the lowest parasitic capacitance, and because metal 3 provides the thickest metal features, and thus the lowest series resistance.

Though the coils in FIG. 4a are shown as square-spirals, the invention is not limited to any particular coil geometry. "Coil", as used herein, simply refers to a length of conductor—a spiral shape is not essential. The invention is effective as long as the current through the inductor's drive coil induces a mutual inductance component in its primary coil. The amplitude of the mutual inductance component depends on a number of variables, including the geometry of the coils, their spatial separation, and the relationships between the primary and drive currents.

Figure 6:
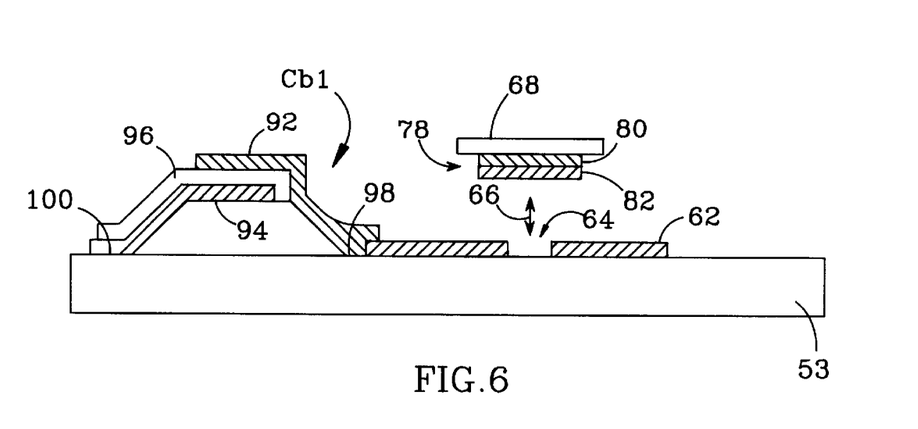
FIG. 6 is a cross section of the oscillator of FIG. 5 taken along section line 6—6 illustrating the relationship of the electrical contact over the gapped signal line and the suspended parallel-plate capacitor structure.
Figure 7:
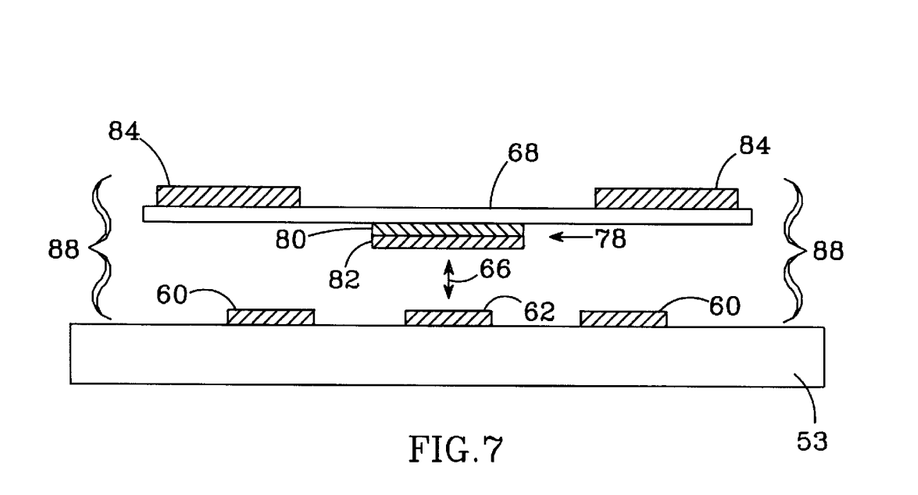
FIG. 7 is a cross section of the oscillator of FIG. 5 taken along section line 7—7 illustrating the control capacitor's top electrode and the electrical contact on the folded cantilever beam.

A portion of the oscillator shown in FIG. 1b illustrating the switch-capacitor pairs is depicted in FIGS. 5, 6 and 7. Oscillator 8 is fabricated on substrate 53, such as a semi-insulating GaAs of Si substrate, using generally known micro fabrication techniques, such as masking, etching, deposition, and lift-off. Substrate 53 is then encapsulated in an IC package 54. The LC network includes a plurality of series-connected MEMS switch-capacitor pairs that are connected in parallel between a pair of output signal lines 55 and 56. Control circuit 18 digitally controls MEMS switches $S_{b1}$ and $S_{b2}$ in each pair to connect and disconnect its capacitor $C_{ba}$ and $C_{b2}$, respectively, to set the total capacitance seen at a pair of output terminals 57 and 58 that are connected across the amplifier to one of a plurality of capacitance levels. Although control circuit 18 is shown as being integrated with the LC network, it may be fabricated on a discrete chip and wire bonded to IC package 54.

Each switch preferably includes a pair of bottom electrodes 60, typically a ground line, formed on opposite sides of a signal line 62 on substrate 53. Electrodes 60, signal line 62, and output signal lines 55 and 56 generally comprise microstrips of an oxidization resistance metal, such as gold, deposited on substrate 53. Signal line 62 includes a gap 64, best illustrated in FIG. 6, that is opened and closed by operation of switch $S_{b1}$, as indicated by arrow 66, to connect and disconnect capacitor $C_{b1}$ in parallel between the output signal lines.

The actuating part of switch $S_{b1}$ comprises a cantilevered arm 68, typically formed of an insulating material, such as silicon dioxide or silicon nitride. In the preferred embodiment, the cantilever arm 68, as best illustrated in FIG. 7, forms a suspended folded-cantilever beam that has a center beam portion 70 that extends over and above gap 64 in signal line 62 and past bottom electrodes 60 by a distance L. A pair of cross-beams 72 are formed at their midpoints to opposite ends of center beam 70 and extend perpendicularly therefrom. Two pair of anchor beams 74 are formed on the ends of cross-beams 72 so that they extend back towards signal line 62 approximately parallel to center beam 70 and are affixed to substrate 53 at four anchor points 76 on opposite sides of the two bottom electrodes 60.

The folded-cantilever beam structure allows cantilever arm 68 to expand horizontally while switching between the on and off positions, which relieves stress on the arm so that it won't buckle and fail. Anchor beams 74 are preferably the same length L as the portion of center beam 70 that extends past bottom electrodes 60 so that they expand at the same rate and thereby avoid twisting the cantilever arm. The folded-cantilever beam also provides a stiff vertical spring constant, which reduces the switch's sensitivity to vibrations. Alternately, cantilever arm 68 may be designed as a two-anchor structure that forms a bridge over the two bottom electrodes and the gap or as a one-anchor structure that forms a "diving-board" over a single bottom electrode and the gap.

An electrical contact 78 is formed on the bottom side of cantilever arm 68 at the midpoint of its center beam 70 so as to face the top of substrate 53 over and above gap 64 in signal line 62. In the preferred embodiment, electrical contact 78 includes a contact pad 80, suitably 1–10 μm thick, that comprises a highly conductive, but soft, metal such as gold and a thin surface pad 82, suitably 100–300 Å thick, that comprises a hard metal such as platinum. Without the surface pad 82, contact pad 80 would become damaged and rough over the lifetime of the switch. The rough surface reduces the contact area between electrical contact 74 and signal line 62, which increases the contact resistance to a point that enough heat may be produced to weld the switch shut. Historically, this is a major reason why micromechanical relays have not been integrated in microelectronic circuits. Tests have shown that the hard surface pad 82 substantially reduces the damage to electrical contact 78 and the underlying signal line 62. The smooth surface maintains the original contact area, and hence the original low contact resistance, approximately 0.1 ohm, that is primarily set by the highly conductive contact pad 80.

A pair of top electrodes 84, typically comprising a metal such as aluminum or gold, for example, are formed atop cantilever arm 68. Top electrodes 84 preferably start above the four anchor points 76, extend along anchor beams 74, cross-beams 72 and center beam 70 to end at positions above the pair of bottom electrodes 60. Top electrodes 84 are connected to signal lines 86 at the four anchor points 76 to receive the actuation voltage from control circuit 18. Center beam 70 and top electrodes 84 are broadened above bottom electrodes 62 to form a pair of control capacitor structures 88. As an option to enhance switch actuation performance and to reduce its sensitivity to vibrations, control capacitor structures 88 may be formed to include a grid of holes 90 that extend through top electrodes 84 and center beam 70. The holes, typically having dimensions of 1–100 μm, for example, reduce the structural mass of cantilever arm 68 and the squeeze film damping effect of air during actuation of switch $S_{b1}$, as indicated by arrow 66.

Capacitor $C_{b1}$ is preferably a high Q MEMS capacitor that is suspended above substrate 53 to reduce parasitic coupling. A height of at least 2 microns has been found to substantially eliminate capacitive coupling between capacitor $C_{b1}$ and substrate 53. MEMS capacitor $C_{b1}$ shown in FIG. 6 is a parallel-plate capacitor that includes top and bottom electrodes 92 and 94, respectively, separated by a spacer layer 96, typically formed of an insulating material such as silicon dioxide. Alternately, MEMS capacitor $C_{b1}$ can be formed with a pair of planar electrodes that have interdigitated fingers. Furthermore, the capacitor may be formed as a conventional metal-oxide-metal, doped polysilicon-oxide-polysilicon, or metal-oxide-semiconductor (MOS) structure formed on the surface of substrate 53, although its parasitic coupling will limit the signal frequency, tuning range and tuning precision of the capacitor bank. In either of these cases, the electrodes are affixed to substrate 53 at anchor points 98 and 100 to connect capacitor $C_{b1}$ in series with switch $S_{b1}$.

In operation, each switch in the switching network is normally in an "Off" position as shown in FIGS. 6 and 7. With the switch in the off-state, signal line 62 is an open circuit due to gap 64 and the separation of electrical contact 78 from signal line 62. The control circuit 18 actuates the switch to the "On" position by applying a voltage to the pair of top electrodes 84. With a voltage applied to top electrodes 84 and control capacitor structures 88, which are separated from bottom electrodes 60 by insulating cantilever arm 68, electrostatic forces attract control capacitor structures 88 (and cantilever arm 68) toward bottom electrodes 60. Actuation of cantilever arm 68 toward bottom electrode 60, as indicated by arrow 66, causes electrical contact 78 to come into contact with signal line 62, thereby closing gap 64 and connecting the capacitor between output terminals 57 and 58. This structure provides a very low insertion loss, approximately 0.1 dB at a 4 GHz signal frequency, and a very high isolation, approximately −50 dB at a switching speed of approximately 1 MHZ and consumes only about 1.4 $\mu$W to switch from the off-state (open circuit) to the on-state (closed circuit) with a closure time on the order of 30 $\mu$s.

The reactance seen at the output terminals 57 and 58 of the LC network is approximately equal to the sum of the capacitances that are in the "On" state in parallel with the fixed inductor. Because the MEMS switch and suspended capacitor exhibit minimal parasitic coupling to the substrate 53, even at RF and millimeter band frequencies, the error between the actual capacitance seen at the output terminals and the theoretical sum of the individual capacitances is low. Thus, the present LC network provides more precise capacitance levels than known capacitor banks. Furthermore, the known integrated capacitor banks that use planar FET technology, the minimum capacitance value in each switch-capacitor pair is not limited by their parasitic capacitances, and thus can be much lower. As a result, the capacitor bank's effective tuning range may be increased by approximately two orders of magnitude, whether the capacitances are selected to exhibit a linear, logarithmic or binary behavior, for example.

The switched capacitor bank is manufactured using a surface micromachining technique that is similar to that used for the switched inductor bank with a total of six masking levels. No critical overlay alignment is required. The starting substrate for the preferred embodiment is a semi-insulating GaAs wafer. Silicon dioxide ($SiO_2$) deposited using plasma enhanced chemical vapor deposition (PECVD) technique is used as the preferred structural material for cantilever arm 68, and polyimide is used as the sacrificial material.

A liftoff profile is formed on the GaAs wafer 53 to expose the portions of its surface where the signal line 62 and bottom electrode 60 (shown in FIG. 5) are to be fabricated. One way to accomplish this is by spinning a first sacrificial layer of thermal setting polyimide (DuPont PI2556) onto the wafer and curing it via a sequence of oven bakes with the highest baking temperature of 250° C. A layer of pre-imidized polyimide (OCG Probimide 285) is then spun on and baked with the highest baking temperature of 170° C. A 1500 Å thick silicon nitride layer is then deposited and patterned using photolithography and reactive ion etch (RIE) in $CHF_3$ and $O_2$ chemistry. The pattern is then transferred to the underlying polyimide layers via $O_2$ RIE.

A layer of gold is electron beam evaporated with a thickness equal to that of the thermal set DuPont polyimide layer to form bottom electrode 60 and signal line 62. The gold liftoff is completed using methylene chloride to dissolve the pre-imidized OCG polyimide, leaving a planar gold/polyimide surface. The cross linked DuPont polyimide has good chemical resistance to methylene chloride. A second sacrificial layer of thermal setting polyimide (DuPont PI2555) is spun on and thermally cross linked to the wafer.

A layer of 200 Å $\mu$m platinum is deposited using electron beam evaporation and liftoff to form the thin surface pad 82 shown in FIG. 7. A mask is used to etch away sacrificial material to expose the anchor points 76 (shown in FIG. 6) for the switch and anchor points 98 and 100 for the capacitor. The etching process undercuts the mask so that the sacrificial material has the slope needed to bring the top electrodes 84 and 92 (shown in FIG. 6) down from their elevated levels to the surface of the substrate.

A layer of 1 $\mu$m gold is deposited using electron beam evaporation and liftoff to form the contact pad 80 and the bottom electrode 94 of the suspended capacitor. A 2 $\mu$m thick layer of PECVD silicon dioxide film is then deposited and patterned using photolithography and RIE in $CHF_3$ and $O_2$ chemistry to form cantilever arm 68 and spacer layer 96. A thin layer (2500 Å) of aluminum film is then deposited using electron beam evaporation and liftoff to form the control capacitor's top electrode 84 and the MEMS capacitor's top electrode 92. Optionally, the capacitor's top electrode 84 can be masked and etched through the underlying silicon dioxide to form the grid of holes 90. And lastly, the entire switched capacitor bank structure is released by dry etching the polyimide films in a Branson $O_2$ barrel etcher. The dry-release is preferred over wet chemical releasing methods to prevent any potential sticking problems during release.

Figure 8A:
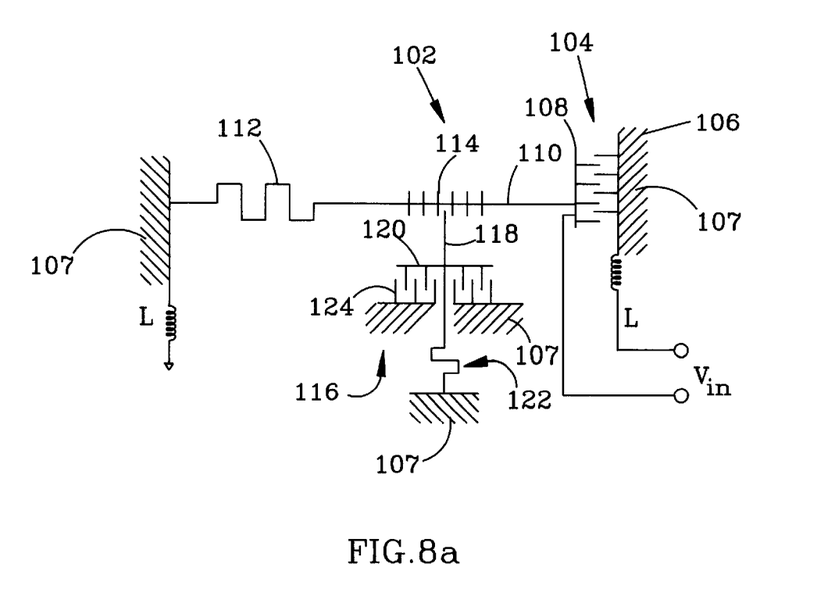
FIG. 8a is a schematic diagram illustrating a reversibly trimmable MEMS capacitor that can replace one or more capacitor-switch pairs shown in FIG. 1b.

As an alternative to the switched capacitor bank shown in FIG 1b, the trimmable oscillator can be implemented using a reversibly trimmable MEMS capacitor of the type schematically illustrated in FIG. 8a in conjunction with a fixed inductor. A combined low frequency control and high frequency signal voltage $V_{in}$ is applied across a single signal capacitor 104. The capacitor's fixed plate 106 is fixed to the substrate 107 while its movable plate 108 is connected to a suspended beam 110. A spring mechanism 112 is formed in the opposite end of beam 110 and anchored to the substrate 107 so that the signal capacitor can move back-and-forth. To isolate the DC control circuit (not shown) from the high frequency signal voltage a pair of large inductors L must be connected between the control circuit and the capacitor.

Trimming is facilitated by placing teeth 114 along suspended beam 110 and using electrostatically controlled actuator 116 positioned perpendicular to the mechanical coupler to selectively engage a stopper 118 with the teeth 114 to trim and then lock the signal capacitor. Actuator 116 includes a movable interdigitated plate 120 that is suspended above the substrate and is connected to stopper 118 and a spring mechanism 122. As shown, the spring mechanism is a folded beam. The interdigitated plate 120 meshes with a pair of fixed interdigitated plates 124 disposed on opposite sides of the stopper.

Normally, the spring holds the stopper in place inside the teeth such that the signal capacitor's movable plate 108 is incapable of moving. During trimming, $V_T$ produces an electrostatic force that pulls stopper 118 away from teeth 114 to allow plate 108 to move. Once the trimming is complete, $V_T$ is switched allowing stopper 118 to extend back into teeth 114, and prevents further movement of plate 108. This configuration ensures that, even after the trimming voltage is withdrawn, plate 108 is incapable of further motion.

Figure 8B:
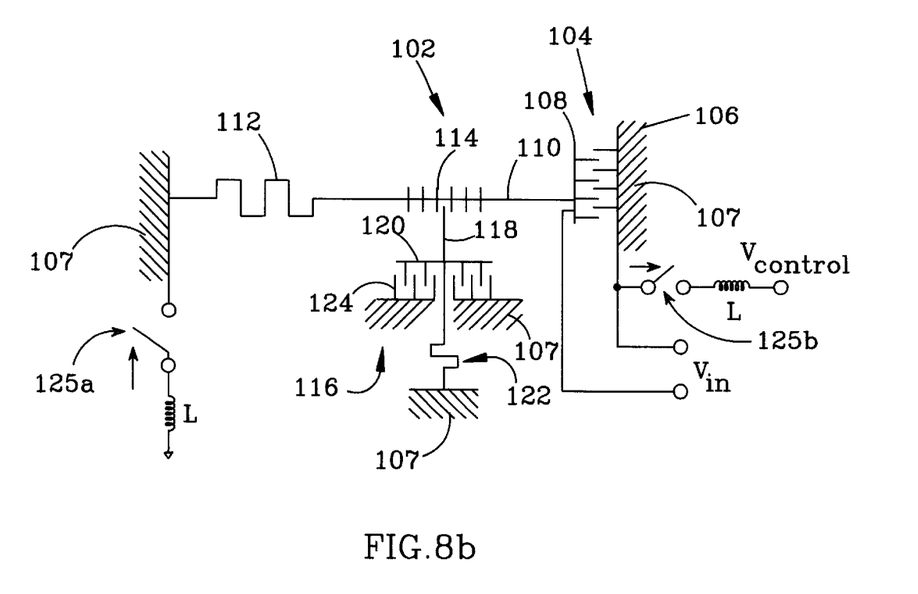

A lower-loss implementation of the reversibly trimmable MEMS capacitor illustrated in FIG. 8a is shown in FIG. 8b. Because the large isolation inductors L are only needed while trimming the capacitor, a pair of MEMS switches 125a and 125b are used to switch the inductors into the circuit when trimming, and out of the circuit when trimming is complete. The low frequency control signal that was combined with the high frequency signal voltage $V_{in}$ in the circuit of FIG. 8a is now a separate signal $V_{control}$, which is applied to the inductor that is switchably connected to capacitor 104 through switch 125b. Disconnecting the inductors L when trimming is complete eliminates their losses during normal operation.

Figure 9:
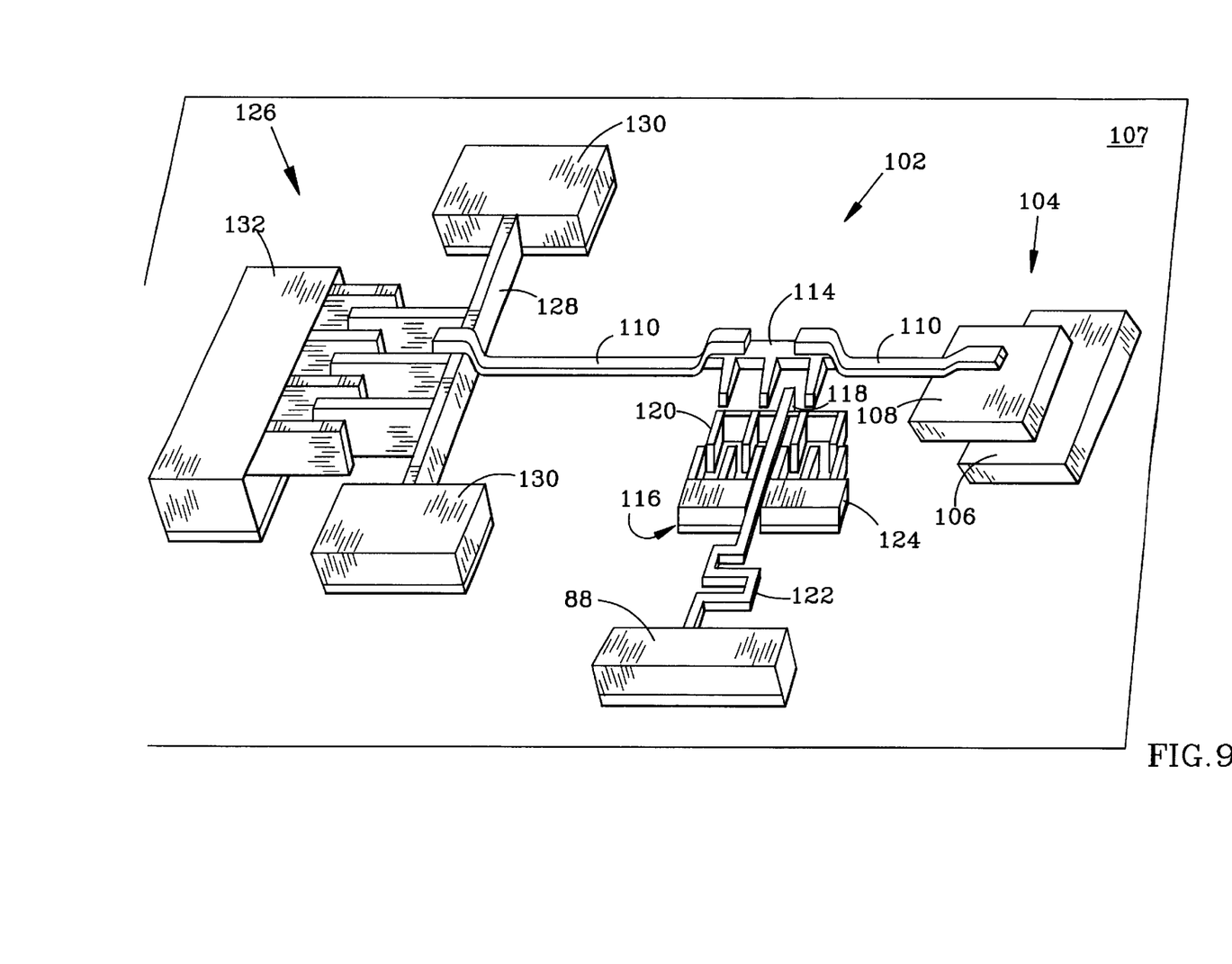
FIG. 9 is a plan view illustrating a preferred master/slave configuration of the reversibly trimmable MEMS capacitor shown in FIG. 8a, and FIG. 10 is a schematic diagram of a tunable multiband oscillator integrated on a common substrate using MEMS technology.

The large isolation inductors L are avoided by using a master-slave configuration as shown in FIG. 9. Folded spring 112 is replaced with an interdigitated control capacitor 126. Signal capacitor 104 is mechanically slaved to control capacitor 126 via suspended beam 110 but is electrically isolated from the DC control circuit. Therefore, the DC control circuit can apply the low frequency control voltage $V_c$ across control capacitor 126 to produce an electrostatic force that attracts its movable plate 128, which is suspended between two contacts 130, towards its fixed plate 132 thereby trimming the signal capacitor without being corrupted by the signal voltage across the signal capacitor. Furthermore, the master-slave configuration can be used to continuously trim the capacitance value without using an actuator. The relative surface areas and spring constants of the control and signal capacitors can be selected so that the signal capacitance is insensitive to the signal voltage.

Figure 10:
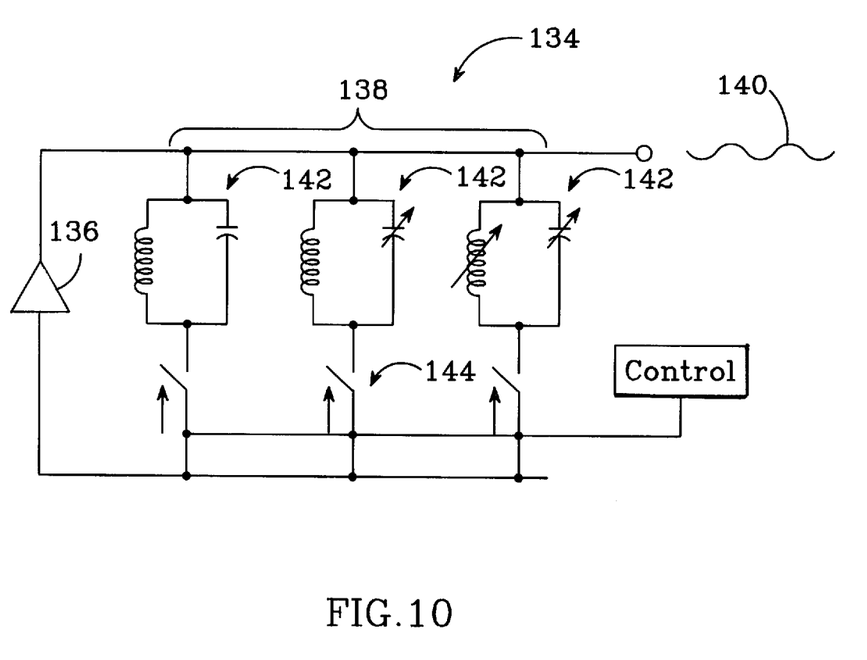

The tunable multiband oscillator 134 shown in FIG. 10 includes an amplifier 136 and an integrated multiband LC network 138 that is connected to provide positive feedback so that the amplifier outputs a local oscillator signal 140 at a selected resonant frequency. Multiband LC network 138 includes multiple singleband LC networks 142 that are tuned to different resonant frequencies in respective frequency bands and a MEMS switching network 144 that interconnects one of the singleband LC networks 142 to the amplifier to set the resonant frequency. The LC networks, the MEMS switching network and (optionally) the amplifier are integrated on a common substrate. The low ohmic loss of MEMS switches allows multiple singleband LC networks to be connected across a broad frequency band without de-Qing multiband LC network 138 and degrading the phase noise performance of the oscillator. The individual singleband LC networks 146 can be either fixed resonator circuits or reversibly trimmable singleband resonators of the type described above. The use of the reversibly trimmable inductors and capacitors provides for continuous fine tuning to compensate for environmental changes, for example.

While particular embodiments of the invention have been shown and described, numerous variations and alternate embodiments will occur to those skilled in the art. Accordingly, it is intended that the invention be limited only in terms of the appended claims.

We claim:

1. A trimmable singleband oscillator, comprising:
an amplifier, and
an integrated tunable LC network connected to said amplifier to provide positive feedback so that the amplifier outputs a local oscillator signal at a resonant frequency, said tunable LC network comprising:
an array of inductor elements,
an array of capacitor elements, at least one of said arrays having a plurality of elements, and
a micro-electromechanical (MEM) switching network that selectively interconnects said plurality of elements to trim the frequency of said oscillator signal, said switching network comprising a plurality of MEM switches that are arranged to operate in response to an actuation signal, said LC network arranged to include a plurality of inductor-MEM switch pairs that comprise:
a first layer on a common substrate that comprises a bottom electrode for said MEM switch, at least one gapped signal line, and a center tap for said inductor element that is connected to one end of the gapped signal line,
a second layer above said first layer which comprises a contact electrode for said MEM switch and the coils for said inductor element,
a third layer above said second layer which comprises a cantilever arm for said MEM switch, and
a fourth layer above said third layer which comprises a top electrode for said MEM switch, said cantilever arm flexing downward in response to an actuation voltage applied across the top and bottom electrodes causing the contact electrode to bridge the gapped signal line and connect the coils for said inductor element into the LC network.

2. The trimmable singleband oscillator of claim 1, wherein the coils for said inductor elements are elevated above said common substrate.

3. A trimmable singleband oscillator, comprising:
an amplifier, and
an integrated tunable LC network connected to said amplifier to provide positive feedback so that the amplifier outputs a local oscillator signal at a resonant frequency, said tunable LC network comprising:
an array of inductor elements,
an array of capacitor elements, at least one of said arrays having a plurality of elements, and
a micro-electromechanical (MEM) switching network that selectively interconnects said plurality of elements to trim the frequency of said oscillator signal, said switching network comprising a plurality of MEM switches that are arranged to operate in response to an actuation signal, said LC network arranged to include a plurality of MEM switch-capacitor pairs that comprise:
a bottom electrode and a gapped signal line formed on a common substrate;
a suspended arm formed of insulating material affixed to said substrate and suspended above said bottom electrode and said gapped signal line;
a contact electrode formed on the underside of said suspended arm positioned facing said gapped signal line;
a top electrode formed atop said suspended arm that is electrostatically attractable toward said bottom electrode upon selective application of a voltage to said top electrode;
a pair of capacitor anchor structures formed on said substrate, one said capacitor anchor structure being electrically connected to the gapped signal line; and
a pair of capacitor electrodes that are connected to the respective capacitor anchor structures to form a signal capacitor,
said electrostatic attraction of said top electrode toward said bottom electrode causing said electrical contact on said suspended arm to bridge said gapped signal line thereby connecting said signal capacitor in said LC network.

4. The trimmable singleband oscillator of claim 3, wherein said pair of capacitor electrodes is suspended above said substrate so that the parasitic capacitance between said signal capacitor and said substrate is low.

5. The trimmable singleband oscillator of claim 3, wherein said top electrode is formed with a grid of holes that extend through said suspended arm.

6. A trimmable singleband oscillator, comprising:

an amplifier, and an integrated tunable resonant network connected to said amplifier to provide positive feedback so that the amplifier outputs a local oscillator signal at a resonant frequency, said resonant network comprising:

an inductor, a trimmable MEM capacitor connected in parallel with said inductor to trim the frequency of said local oscillator signal, said MEM capacitor having a signal capacitor that is adjusted to trim the resonant frequency and an actuator that engages said signal capacitor once trimmed to fix said resonant frequency, said inductor and said MEM capacitor being integrated on a common substrate, said MEM capacitor comprising:

a flexure structure that is anchored to and suspended above said substrate so that it flexes along a direction of motion;

a pair of opposing plates that form said signal capacitor, at least one of said plates being connected to said flexure structure so that it can move in response to a control voltage to set the capacitance of said signal capacitor; and a plurality of teeth that are coupled to and move with said moving plate, said actuator responding to a switch voltage to disengage a stopper from said teeth and allow said control voltage to trim the signal capacitor's capacitance and then reengage said stopper in said teeth such that the movable plate is fixed.

7. The trimmable singleband oscillator of claim 6, wherein said actuator comprises a tunable capacitor in which the stopper is attached to a moveable plate that is suspended from a flexure mechanism so that it opposes a fixed plate, said switch voltage creating an electrostatic force between the plates that causes the moveable plate to move against the electrostatic force to engage and disengage the stopper.

8. A trimmable singleband oscillator, comprising:

an amplifier, and an integrated tunable resonant network connected to said amplifier to provide positive feedback so that the amplifier outputs a local oscillator signal at a resonant frequency, said resonant network comprising:

an inductor, a trimmable MEM capacitor connected in parallel with said inductor to trim the frequency of said local oscillator signal, said MEM capacitor having a signal capacitor that is adjusted to trim the resonant frequency and an actuator that engages said signal capacitor once trimmed to fix said resonant frequency, said inductor and said MEM capacitor being integrated on a common substrate, said signal capacitor comprising:

a master capacitor on said substrate, said master capacitor having a pair of opposing plates, at least one of said plates being suspended so that it is movable in response to an electrostatic force produced by a control voltage applied across said master capacitor;

a slave capacitor on said substrate that responds to a signal voltage, said slave capacitor having a pair of opposing plates, at least one of said plates being suspended so that it is movable; and a mechanical coupler suspended above said substrate that slaves the motion of said slave capacitor's movable plate to the motion of said master capacitor's movable plate to trim the capacitance of said slave capacitor while electrically isolating the slave capacitor from the master capacitor.

9. A tunable multiband oscillator, comprising:

an amplifier, and an integrated tunable LC network connected to said amplifier to provide positive feedback so that the amplifier outputs a local oscillator signal at a resonant frequency, said LC network comprising:

a plurality of LC circuits that are tuned to different resonant frequencies in respective frequency bands, and a micro-electromechanical (MEM) switching network that interconnects one said LC circuits to said amplifier to set the resonant frequency of said oscillator signal, said LC circuits and said MEM switching network being integrated on a common substrate.

10. The tunable multiband oscillator of claim 9, wherein each said LC-circuit includes an inductor and a capacitor that are elevated above said common substrate to reduce parasitics.

11. The tunable multiband oscillator of claim 9, wherein said switching network comprises a plurality of MEM switches that are arranged to operate in response to an actuation signal.

12. A tunable multiband oscillator, comprising:

an amplifier, and an integrated tunable LC network connected to said amplifier to provide positive feedback so that the amplifier outputs a local oscillator signal at a resonant frequency, said resonant network comprising:

a plurality of tunable LC circuits that correspond to different coarse frequency bands, a controller that finely trims said LC circuits to respective resonant frequencies in the different frequency bands, and a micro-electromechanical system (MEMS) switching network that interconnects one said LC circuits to said amplifier to set the resonant frequency of said oscillator signal, said LC circuits and said MEM switching network being integrated on a common substrate, wherein each said tunable LC circuit includes a tunable inductor which comprises:

a conductive primary coil carrying an alternating primary current, a conductive drive coil carrying an alternating drive current, said drive coil in proximity to said primary coil such that said drive current induces mutual inductance components in said primary coil, and a drive circuit that sets the phase and amplitude relationships between said drive current and said primary current to establish a desired inductance for said primary coil and trim the resonant frequency.

13. A tunable multiband oscillator, comprising:

an amplifier, and an integrated tunable LC network connected to said amplifier to provide positive feedback so that the amplifier outputs a local oscillator signal at a resonant frequency, said resonant network comprising:

a plurality of tunable LC circuits that correspond to different coarse frequency bands, a controller that finely trims said LC circuits to respective resonant frequencies in the different frequency bands, and a micro-electromechanical system (MEMS) switching network that interconnects one of said LC circuits to said amplifier to set the resonant frequency of said oscillator signal, said LC circuits and said MEM switching network being integrated on a common substrate, wherein each said tunable LC circuit includes a tunable MEMS capacitor that comprises:

a signal capacitor that is adjusted to trim the resonant frequency and an actuator that engages said signal capacitor once trimmed to fix said resonant frequency, said signal capacitor comprising:

a master capacitor on said substrate, said master capacitor having a pair of opposing plates, at least one of said plates being suspended so that it is movable in response to an electrostatic force produced by a control voltage applied across said master capacitor;

a slave capacitor on said substrate that responds to a signal voltage, said slave capacitor having a pair of opposing plates, at least one of said plates being suspended so that it is movable; and   a mechanical coupler suspended above said substrate that slaves the motion of said slave capacitor's movable plate to the motion of said master capacitor's movable plate to trim the capacitance of said slave capacitor while electrically isolating the slave capacitor from the master capacitor.

14. A tunable multiband oscillator, comprising:

an amplifier, and an integrated tunable LC network connected to said amplifier to provide positive feedback so that the amplifier outputs a local oscillator signal at a resonant frequency, said resonant network comprising:

a plurality of tunable LC circuits that correspond to different coarse frequency bands, a controller that finely trims said LC circuits to respective resonant frequencies in the different frequency bands, and a micro-electromechanical system (MEMS) switching network that interconnects one said LC circuits to said amplifier to set the resonant frequency of said oscillator signal, said LC circuits and said MEM switching network being integrated on a common substrate, wherein each said tunable LC circuit includes a tunable MEMS capacitor that comprises:

a master capacitor on said substrate, said master capacitor having a pair of opposing plates, at least one of said plates being suspended so that it is movable in response to an electrostatic force produced by a control voltage applied across said master capacitor;

a slave capacitor on said substrate that responds to a signal voltage, said slave capacitor having a pair of opposing plates, at least one of said plates being suspended so that it is movable; and p3 a mechanical coupler suspended above said substrate that slaves the motion of said slave capacitor's movable plate to the motion of said master capacitor's movable plate to trim the capacitance of said slave capacitor while electrically isolating the slave capacitor from the master capacitor.

* * * * *